United States Patent [19]
Smith

[11] Patent Number: 6,064,217
[45] Date of Patent: *May 16, 2000

[54] FINE PITCH CONTACT DEVICE EMPLOYING A COMPLIANT CONDUCTIVE POLYMER BUMP

[75] Inventor: Kenneth R. Smith, Plano, Tex.

[73] Assignee: EPI Technologies, Inc., Richardson, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/705,886

[22] Filed: Aug. 28, 1996

Related U.S. Application Data

[63] Continuation-in-part of application No. 08/570,159, Dec. 11, 1995, abandoned, which is a continuation-in-part of application No. 08/427,974, Apr. 21, 1995, Pat. No. 5,475,317, which is a continuation of application No. 08/172,580, Dec. 23, 1993, abandoned.

[51] Int. Cl.$^7$ .............................. G01R 31/02; H01R 4/58
[52] U.S. Cl. ........................... 324/760; 324/758; 439/86
[58] Field of Search ...................... 324/760, 754, 324/755, 757, 758, 765; 439/66, 86, 89, 91

[56] References Cited

U.S. PATENT DOCUMENTS

| | | | |
|---|---|---|---|
| 3,648,002 | 3/1972 | Du Rocher | 200/265 |
| 3,832,632 | 8/1974 | Ardezzone | 324/756 |
| 3,971,610 | 7/1976 | Buchoff et al. | 439/75 |
| 4,288,841 | 9/1981 | Gogal | 361/414 |
| 4,329,642 | 5/1982 | Luthi et al. | 324/158 F |
| 4,340,860 | 7/1982 | Teeple, Jr. | 324/158 F |
| 4,437,718 | 3/1984 | Selinko | 339/61 M |
| 4,554,505 | 11/1985 | Zachry | 324/158 F |
| 4,739,257 | 4/1988 | Jenson et al. | 324/158 F |
| 4,899,107 | 2/1990 | Corbett et al. | 324/158 F |
| 4,956,605 | 9/1990 | Bickford et al. | 324/158 F |
| 5,006,792 | 4/1991 | Malhi et al. | 324/158 F |
| 5,006,796 | 4/1991 | Burton et al. | 324/158 F |
| 5,014,161 | 5/1991 | Lee et al. | 361/709 |
| 5,061,192 | 10/1991 | Chapin et al. | 439/66 |
| 5,123,850 | 6/1992 | Elder et al. | 439/67 |
| 5,173,451 | 12/1992 | Kinsman et al. | 437/209 |
| 5,207,585 | 5/1993 | Byrnes et al. | 439/66 |
| 5,248,262 | 9/1993 | Busacco et al. | 439/66 |

(List continued on next page.)

OTHER PUBLICATIONS

Tek's stations tailored for fine–pitch use, EE Times Interactive, Nov. 7, 1994, Issue 822.

A Novel Technique for Known Good Die Processing Eliminates Failure Mechanisms Caused by Traditional KGD Processing, Peter Delivorias et al., IEEE Reliability & Physics Conference, Apr., 1995, pp. 463–471.

(List continued on next page.)

*Primary Examiner*—Josie Ballato
*Assistant Examiner*—Russell M. Kobert
*Attorney, Agent, or Firm*—Jenkens & Gilchrist, P.C.

[57] ABSTRACT

A reusable test socket is described for testing fine pitch devices including singulated bare die, semiconductor wafers, chip sized packages, printed circuit boards, and the like to determine that the fine pitch device is not faulty. The socket contains a circuit pad pattern in the mirror image of the pattern of contact points, usually bond pads of the fine pitch device to be tested. Each pad of the socket contains a conductive elastomeric probe which has been "screened" onto the bond pad. The socket also contains an alignment template for orienting the fine pitch device onto the elastomeric probes of the contact point pattern of the test socket. Additionally, the socket can be a singular piece or it can be made of two main pieces; the first being a socket, and the second being a test board designed to mate with the socket. The disclosed invention also includes a method of using the reusable test socket which includes the steps of placing the fine pitch device onto the test socket, placing the socket into electrical continuity with test equipment and conducting electrical tests at ambient as well as elevated temperatures.

24 Claims, 5 Drawing Sheets

U.S. PATENT DOCUMENTS

| | | | |
|---|---|---|---|
| 5,302,891 | 4/1994 | Wood et al. | 324/158 F |
| 5,329,423 | 7/1994 | Scholtz | 361/760 |
| 5,358,417 | 10/1994 | Schmedding | 439/178 |
| 5,453,701 | 9/1995 | Jensen et al. | 324/755 |
| 5,475,315 | 12/1995 | Smith | 324/760 |
| 5,489,854 | 2/1996 | Buck et al. | 324/761 |
| 5,493,237 | 2/1996 | Volz et al. | 324/754 |
| 5,633,596 | 5/1997 | Ilani | 324/754 |
| 5,656,945 | 8/1997 | Cain | 324/765 |

OTHER PUBLICATIONS

Chip–scale Packages: Next Best To Bare Die, EE Times Interactive, Jun. 26, 1995, Issue 854, Section: Interconnects & Packaging.

Minimalist packaging scheme is gaining adherents—Chip–scale breaks from the pack, Terry Costlow, EE Times Interactive, Jun. 19, 1995, Issue 853, Section: News.

Internconnect road map is in the works, Terry Costlow, EE Times Interactive, Jun. 26, 1995, Issue 854, Section: News.

It's becoming a packaging challenge, Glenda Derman, EE Times Interactive, Aug. 28, 1995, Issue 863, Section: Technology Trends—Surface Mount Technologies.

MCMs require diverse test approaches, Lynn E. Roszel, EE Times Interactive, Oct. 9, 1995, Issue 869, Section: Interconnects & Packaging.

Chip–size packages proliferate, Glenda Derman, EE Times Interactive, Dec. 15, 1995, Issue 880, Section: Best 1995 Technologies: Packaging & Interconnects.

Designers face array of package options, Terry Coslow, EE Times Interactive, Mar. 18, 1996, Issue 893, Section: Design.

New packages pose space challenges. Glenda Derman, EE Times Interactive, Mar. 18, 1996, Issue 893, Section: Technology Trends.

Surface Mount—A peek at the future?, Phil Marcoux, EE Times Interactive, Apr. 1, 1996, Issue 895, Section: Design—Components.

Enhanced flip–chip techniques emerge, Terry Costlow, EE Times Interactive, Apr. 29, 1996, Issue 899, Section: News.

*Japan's Electronic Packaging Strategies,* Chapter 4, Section 2, Aug. 30, 1995; JTEC/WTEC Hyper–Librarian.

Practical Design and Manufacturing Issues of Fine Pitch VLSI Packaging Tutorial, Shankara Prasad, Ph.D., APT International SEMICON West 96, Jul. 15, 1996.

Novel Uses of Flexible Circuit Technology in High Performance Electronic Applications, Tom Distefano and Joseph Fjelstad, Tessera, Inc., San Jose, CA (Date Unavailable).

IC Devices, and Glossary, 1995 Microelectronics and Computer Technology Corporation (Month Unavailable).

FINE PITCH CONTACT DEVICE EMPLOYING A COMPLIANT CONDUCTIVE POLYMER BUMP

RELATED CASES

This application is a continuation-in-part of patent application Ser. No. 08/570,159, filed on Dec. 11, 1995, now abandoned which is a continuation-in-part of patent application Ser. No. 08/427,974, filed on Apr. 21, 1995 which has now issued as U.S. Pat. No. 5,475,317 and which is a continuation of patent application Ser. No. 08/172,580, filed on Dec. 23, 1993, now abandoned.

BACKGROUND OF THE INVENTION

1. Technical Field of the Invention

This invention relates to a method and apparatus of making and using a reusable test socket or probe card for testing and contacting unpackaged semiconductor devices, semiconductor wafers, bare and populated printed circuit boards, and other fine pitch devices such as chip-scale packages and ball-grid array packages.

2. Description of Related Art

Multi-chip Modules (MCMs), or Hybrid Integrated Circuits, are manufactured by combining multiple integrated circuit dies within one package. Yield rates for such MCMs are usually low because if any one of the die within a MCM malfunctions, the entire package is considered defective. For example, MCMs which contain 20 individual die, with an average yield rate of 97.3%, would be expected to have an overall yield rate of 57.3% because of the cumulative effect of the individual yield rates of each die. Because the sum cost of the die can be quite expensive, the production of MCMs is frequently unprofitable and the cost to the consumer of MCMs is frequently unjustifiable.

Thus, there is a need to certify that each individual die is a "known good die" prior to packaging the die within the MCM. Some prior art references describe attempts to produce a known good die by first packaging the die, conducting tests at various temperatures, subjecting the integrated circuit to "burn-in" at elevated temperature, recovering the die by destroying the packaging to remove the die and then placing it within the hybrid circuit or MCM. Such a process is labor intensive and expensive and still could result in uncertainty in determining whether a die is a "known good die." Thus, there is a need for a device and method for testing bare die which allow bare die to be tested in a more cost effective manner.

Other prior art references disclose various probe cards which test the die while on the wafer. Some prior art references, such as U.S. Pat. No. 5,103,557 issued to Leedy, disclose performing tests before the metallization layers are added to the individual die still contained on the semiconductor wafer. These tests, however, only certify that a die is good at this stage in its manufacturing cycle. The completely manufactured die is not tested. It is important to test the completely manufactured die because defects can be introduced, not only when the metallization layers are added, but also when the die is separated from the semiconductor wafer.

A problem with the above device and test methods is the utilization of rigid metal probes or probes with rigid metal tips for establishing electrical continuity. Such probes are difficult to manufacture and require high maintenance. Because the individual probes are so minute, the practical difficulties of using probe cards include keeping the probes straight, keeping them at an even or planar height, and establishing electrical contact through all of the probes in the proper location simultaneously without exerting so much pressure on the semiconductor wafer that it is damaged. Additionally, the mere act of establishing electrical contact with the proper points within a circuit can be a challenging task. Frequently, special lenses or cameras are required to accomplish this task. Thus, there is a need for a device which allows the task of connecting test equipment to the die to be routine, simple and quick.

Another problem with using probe cards as disclosed by Leedy is that they typically have inherent frequency response characteristics which inhibit full functional testing of an integrated circuit throughout the desired frequency ranges. Further, these types of probe cards are designed to contact a die while it is still an integral part of the entire semiconductor wafer. They are not intended for testing bare singulated die. Thus, the cards cannot be used to test the overall reliability of the bare die to determine whether the die will work for a significant duration of time. Neither do they provide a means for testing the die over a broad range of temperatures.

Other prior art references, such as European patent No. 554,622 issued to Pedder, disclose the use of a test socket in connection with a test station wherein the interface between the bare singulated die and the test socket is a plurality of conductive microbumps soldered onto the test socket contact pads. A problem with such a device is that it is very difficult to manufacture bumps such that pad to bump contact is established for all die bond pads because of the rigidness of the solder microbumps. In other words, use of such bumps introduces planarity problems. Furthermore, the use of such bumps does not insure solid and continuous electrical contact with the bare die bond pads. Additionally, the frequency bandwidth is limited. Thus, these metal bumps do not support all of the types of required tests which may have to be performed even if they do successfully establish electrical continuity with the die bond pads.

Other disclosures utilize a polyimide film upon which metallic microbumps are placed. For example, see *Aehr Test, Nitto Denko Develop KGD Solution*, Electronics Packaging & Production, September 1993, at 11–12. The article discloses a plurality of gold or nickel plated bumps on polyimide film with a proprietary hole-making technology which connects the bond pads of a die to the pads of a substrate. The use of such a carrier allows for interfacing a bare die to a burn-in board and for conducting burn-in tests. One problem with such an implementation is the difficulty of plating the small microbumps; the disclosure does not adequately disclose the method of plating the microbumps. A second technical problem is the establishing of electrical continuity between the plated bumps and the pads of a substrate or test socket. In fact, in this disclosure, it is clear that this connection means involves the use of a proprietary technology that is not generally available to the public. A third technical problem is damage caused by rigid bumps to die bond pads during temperature excursions typically occurring during high temperature test and burn-in. Finally, this method does not completely solve the previously discussed planarity problem. While the polyimide film establishes some give and take, which helps alleviate the planarity problem, high precision and consistency is still required in order to build a plurality of microbumps, each of which must be sufficiently close to the same plane to establish electrical continuity with the bond pads of the bare die. This occurs because the range of flexible movement resulting from the use of a polyimide film carrying a rigid contact or probe is small. Furthermore, such devices have been known to limit the frequency bandwidth and therefore the types of test and burn-in procedures that can be run or executed.

Other methods of testing bare die include the permanent addition of interface circuitry to the bare die; circuitry which allows the die to be interfaced to a burn-in board. Obvious disadvantages include the increased size and weight of the die packaging. Further, such a solution significantly increases the labor and material costs of testing a bare die. To solve the increased weight and size problem, other disclosures have included the final step of removing or peeling away the added packaging. A well recognized disadvantage of this solution is that the bare die bond pads are frequently damaged as discussed by Falconer and Lippold, *A Survey of Techniques for Producing Known Good Die*, ISHM-Nordic 31st Annual Conference, at 3 (1993).

Because of the low yield rates of MCMs and because testing singulated bare die has heretofore not been economically feasible or technically acceptable, the costs of MCMs have been high when compared to the creation of circuits comprised of the combination of individual integrated circuits which contain the same die as the MCM. Thus, the MCM manufacturing industry has been suppressed relative to the demand for such a product in part because of the high cost of MCMs. Unless a particular design requires minimization of space and power consumption, the high cost of an MCM is not justified. Therefore, up until now, a need has existed to create an apparatus and method of cost effectively testing bare singulated die to produce "known good die" for inclusion in multi-chip modules.

In addition to there being a need for contacting and testing bare singulated die, there is also a need for contacting and testing other unpackaged fine pitch devices such as semiconductor wafers, individual die in wafer form (wafer probe), packaged semiconductor devices such as micro ball grid arrays and chip-scale packages as well as apparatus for testing or carrying semiconductor devices including bare printed circuit boards, and populated circuit boards.

The basic problem encountered during testing each of the fine pitch devices listed including bare die is related to the ability to contact the contact points given their size and quantity on a typical device. Additionally, the problem continues to become more challenging. Electronic device manufacturing firms continue to push the miniaturization of electronic packaging technologies. For example, low cost quad flat packs are being made continuously thinner and with smaller profile packages. Examples of some of the thinner and smaller packages are the thin quad flat packs ("TQFP") and tape-automated bonding ("TAB") packages. Discrete component packages of capacitors, resistors, and inductors are expected to shrink at least another twenty percent in size. Printed circuit boards and other devices are also continuing to shrink. Some experts believe that the current limit of 0.4 mm pitch in surface mount technology applications will soon be reduced to 0.15 mm pitch.

The trend towards finer pin pitch and package miniaturization is clearly creating new problems and needs in terms of contact and test technology. These current trends will be stymied unless a new technology for contacting the ever increasing number of contact points per square inch and ever decreasing contact point size can be developed successfully so that fine pitch devices may be tested properly at ambient temperature as well as elevated and lowered temperatures, if necessary.

One packaging technique being used to reduce device size is the ball grid array. Ball grid arrays, including ceramic ball grid arrays, are known to deliver far higher densities than packages with leads placed around the perimeter of the package. Another packaging technique that offers even higher densities than ball grid arrays is known as the chip-scale package. Chip-scale packages use leads on a surface that is very slightly larger than the chip within the package.

It is known that all of these new technologies require advancements in substrate technology as well as in burn-in and test techniques. The smallest possible package is no package at all or a bare die. It is known, however, that the use of bare die has been thwarted by their dependence on a viable supply of known good die. More generally, however, the development of all of these types of packaging technologies rely upon development of devices and methods for testing and contacting these increasingly smaller contact points which are continuously increasing in density.

The problem of contacting so many small contact points for these listed devices is the same problem encountered for testing bare die, namely, establishing a solid conductive contact adequate even for burn-in testing in a manner that does not require some sort of bonding to the device being tested.

SUMMARY OF THE INVENTION

The invention solves the shortcomings of the prior art by disclosing a reusable test carrier for testing fine pitch devices, and more particularly, bare singulated semiconductor die, semiconductor wafers, individual die in wafer form (wafer probe), packaged semiconductor devices, chip-scale packages, and circuitry for testing or carrying semiconductor devices including bare printed circuit boards, populated circuit boards, ball grid arrays and chip-scale packages. The reusable test carrier utilizes electrically conductive elastomeric bumps (hereinafter, "elastomeric probes") in lieu of rigid metallic probes or solder balls. The conductive elastomeric probes are permanently applied to an electrically conductive circuit pad pattern of a test carrier whose circuit pad layout is based upon the layout of the contact point pattern of the fine pitch device to be tested. Then, the adhesive quality of the probe is rendered in-adhesive through a curing process. Curing the probes in this manner allows the probes to make repetitive and temporary contact with the device being tested or contacted.

An important element in establishing electrical continuity between the pads of the test carrier and the corresponding contact points of the fine pitch device is the placement of the device being tested or contacted such that contact points are aligned and in electrical contact with the electrically conductive elastomeric probes. The alignment problem has been solved by the utilization of an alignment template. An alignment template consists of a board made out of printed circuit board material, or ceramic, or the like, with an aperture or hole which is approximately the size and shape of the perimeter of the device being tested. The aperture is located within the alignment template such that the placement of the device within the aperture or hole forces the corresponding pads and contact points of the device to properly align.

A second embodiment for solving the alignment problem contains a number of strips or posts of a hard material that are permanently placed on the surface of the test carrier such that the shape defined by the internal points of the strips or posts approximately defines the perimeter of the die or device being tested. Like the alignment template, proper alignment of the corresponding bond pads of the die or contact points of the device being tested and the circuit pads of the test carrier occurs when the die or device being tested is placed within the arrangement of strips or posts.

Alternatively, the strips or posts are placed to mate with the device being tested in a manner that directs the alignment of the devices. For example, the device may contain apertures formed to mate with the strips or points whenever the device is properly aligned.

Another embodiment for solving the alignment problem involves using robotics to align and place the die or device being tested onto the die carrier or test socket.

Alternatively, optical alignment may be used to solve the alignment problem. This technique consists of viewing the surfaces to be aligned and overlaying the images electronically. One surface is adjusted until perfect alignment is achieved. The two surfaces are then brought together.

The method for testing includes, if necessary, removing oxidation from the bond pads or contact points of the device being tested prior to placing the device being tested within the carrier and into electrical continuity with the test equipment. The natural build up of oxidation on the bond pads of die, for example, has been found to interfere with test results to the point that a good die could feasibly be misdiagnosed as being defective. The method of testing the bare die or fine pitch device also includes pushing and securing the die or fine pitch device against the conductive elastomeric probes of the carrier until electrical continuity is established between each bond pad of the die or contact point of the fine pitch device being tested and its corresponding elastomeric probe.

The invention also includes a method for accomplishing elevated temperature burn-in for bare die, semiconductor wafers and other semiconductor devices and fine pitch devices, packaged and unpackaged, needing burn-in certification.

Regarding bare die and other devices needing burn-in certification or testing, there is a need for ascertaining that the die or device is in continuous electrical communication with the circuit or mother board during what is commonly known as "burn-in" testing. Burn-in testing usually occurs within an oven or chamber, and involves continuously operating the device being tested under extreme or at least increased temperature conditions. In ordinary circumstances, confidence in established art usually eliminates the need to continuously monitor or verify electrical continuity while the device is being operated in a burn-in board test circuit. However, because this invention utilizes packaging that is used on a temporary basis, continuous electrical continuity cannot be assumed. Thus, the invention discloses a method for verifying electrical continuity. Specifically, the method is to continuously or nearly continuously obtain data or measure electrical voltages from the die by connecting appropriate cables between the burn-in board and test and measurement devices during the burn-in process. A reading of non-expected value would then indicate either failure of the die or a break in electrical continuity.

Additionally, the method for testing includes a means of lowering or elevating the temperature of the die or semiconductor device under test (DUT) by conductive heat transfer to or from the DUT by placing a thermoelectric cooler (TEC) in thermal contact with the die. Use of the TEC is preferred in lieu of current methods of convective heat transfer using conventional forced air temperature forcing devices.

The elastomeric conductive probes and the alignment template or posts primarily accomplish the overall object of this invention which is to provide an apparatus and method for testing bare singulated die and other fine pitch devices that greatly reduce the cost of such tests and which makes testing of certain products or devices possible.

The method for testing fine pitch devices, and more specifically, semiconductor wafers, includes placing the wafer within the carrier and performing wafer level burn-in test. For each die which is identified as being defective during the wafer level burn-in test, a "map" is created to track which die on the semiconductor wafer have failed either while being exercised during burn-in or prior to burn-in test. Thereafter, the individual bare die are diced from the semiconductor wafer after which further testing of bare die not known to be failed, as indicated by the map, may be performed. Completion of the final testing leads to the conclusion as to whether a bare die is a known good die and can be packaged either individually or in a multichip module.

DETAILED DESCRIPTION OF THE PRESENTLY PREFERRED EXEMPLARY EMBODIMENTS

The present invention, in all of its embodiments, solves deficiencies of the prior art to achieve testing of a bare singulated die and other fine pitch devices by creating a carrier which is designed to hold a fine pitch device and to establish electrical continuity with the contact points of the fine pitch devices. These deficiencies are primarily solved by the utilization of electrically conductive elastomeric probes to contact the contact points of the fine pitch device, by way of example, the bond pads of a die, an alignment template to position the fine pitch device, and an overall configuration which allows for repetitive and labor efficient use of the carrier. Furthermore, some fine pitch devices, by way of example, a bare die, can be held in place throughout testing. This allows the bare die to be tested and certified for all required temperatures. The specific tests conducted vary and are determined by the complexity of the bare die and by the certification requirements for the die. One skilled in the art can readily determine what types of test procedures are appropriate and can use this disclosure to perform the tests. Nonetheless, the specific apparatus and test procedures used by this inventor are also disclosed.

Figure 1:
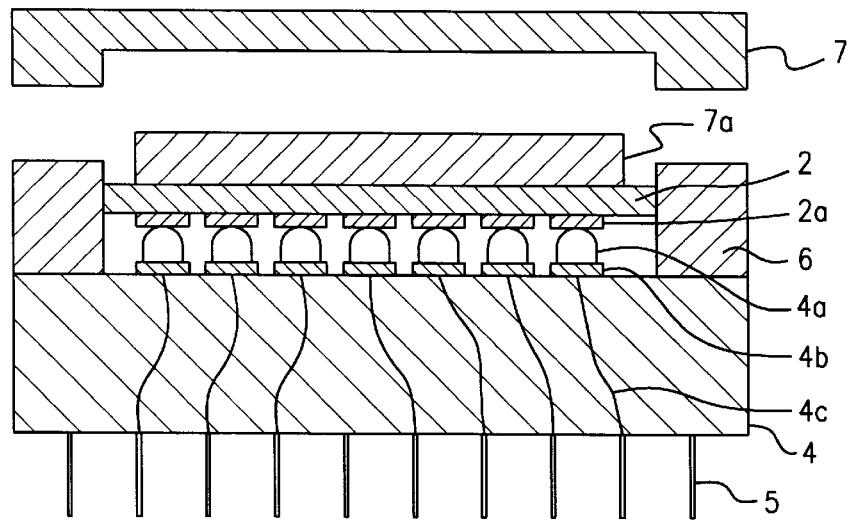
FIG. 1 shows a cutaway view of the die carrier in a socket configuration with TEC and heat exchanger.

Referring now to FIG. 1, there is shown a cutaway view of a die carrier in a socket configuration with a TEC and a heat exchanger. As is seen in FIG. 1, electrical contact between the circuit pads 4b of a die carrier 4 and the bond pads 2a of a bare die 2 occurs through the elastomeric probes 4a. Specifically, die carrier 4 contains a plurality of circuit pads 4b which are arranged to correspond with the bond pads 2a of the bare die 2 such that the bond pads 2a of the bare die 2 line up directly over the circuit pads 4b of the die carrier 4 when the bare die 2 is properly positioned over the die carrier 4. The method of placing the circuit pads 4b on the surface of the die carrier 4 is old and well known in the art. The conductive elastomeric probes 4a are permanently placed upon circuit pads 4b, wherein the elastomeric probes 4a have been designed to continuously and repetitively establish electrical continuity between it and either bond pads 2a of different die 2, or any other type of electrically conductive probe or lead including other elastomeric probes. Specifically, after the probes are placed onto the circuit pads 4b, they are cured to establish a resilient non-adhesive surface to support repetitive contacts with other conductors. It is not a requirement that every bond pad 2a on the die 2 have a corresponding circuit pad 4b on the die carrier 4. The only circuit pads 4b required on the die carrier 4 are the ones through which electrical signals are to be applied and/or measured during testing. However, for the sake of simplicity and engineering economy, the preferred embodiment includes a pad pattern on the die carrier 4 which is a mirror image of the bond pad pattern of the bare die 2. Moreover, the shape or size of the circuit pad may be varied so long as permanent contact may be established with the electrically conductive elastomeric probe of the carrier.

Still referring to FIG. 1, each circuit pad 4b of the die carrier 4 contains an electrically conductive elastomeric probe 4a which is permanently mounted thereon. Various methods can be utilized for depositing these conductive elastomeric probes 4a on the circuit pads 4b. However, the one found to be the most satisfactory to this inventor is to have the conductive elastomeric probes 4a screened or stenciled onto the circuit pads 4b and cured through conventional methods as are known by those skilled in the art as described. For example, see U.S. Pat. No. 5,074,947 which is incorporated herein by reference for all purposes.

The composition of the elastomeric probes is not significant so long as the elastomeric probes 4a meet certain performance criteria. The performance criteria for testing bare die include: (1) the elastomer must be able to withstand wide ranges of temperature, the minimum sustained temperature being minus 55° Celsius and the maximum temperature being plus 125° Celsius (in the event Military certification is desired); (2) the elastomeric probes 4a must be somewhat malleable in texture; and (3) the elastomeric probes 4a must provide a low throughput resistance over a wide frequency range and must be able to freely conduct electricity as a result of being doped with a proper conductive doping agent as is known by those skilled in the art. If this disclosed device is to be used to test other fine pitch devices or discretes, then the requirements may change. For instance, one military certification standard requires the minimum sustained temperature to be minus 65° Celsius and maximum sustained temperature to be plus 175° Celsius. Such changes are intended to be a part of the disclosed invention. Furthermore, it is important that the elastomeric probes 4a be able to maintain their properties through multiple uses. The composition of acceptable elastomers include, but are not limited to, polyepoxides, polystyrenes, polyimides and other elastomeric polymers and epoxies. The preferred material is an electrically conductive epoxy resin. Proper doping agents to impart electrical conductivity to the resins include tungsten, gold, copper and silver. The preferred doping agent is silver which has been used to render adhesives electrically conducting as described in U.S. Pat. No. 5,196,371 and U.S. Pat. No. 5,237,130, both being issued to Kulesza et al, incorporated herein for all purposes. However, the concept of utilizing conductive polymers can be manifested in other similar and undeveloped compounds or with other doping agents not mentioned herein and is an intended part of the invention.

Figure 2:
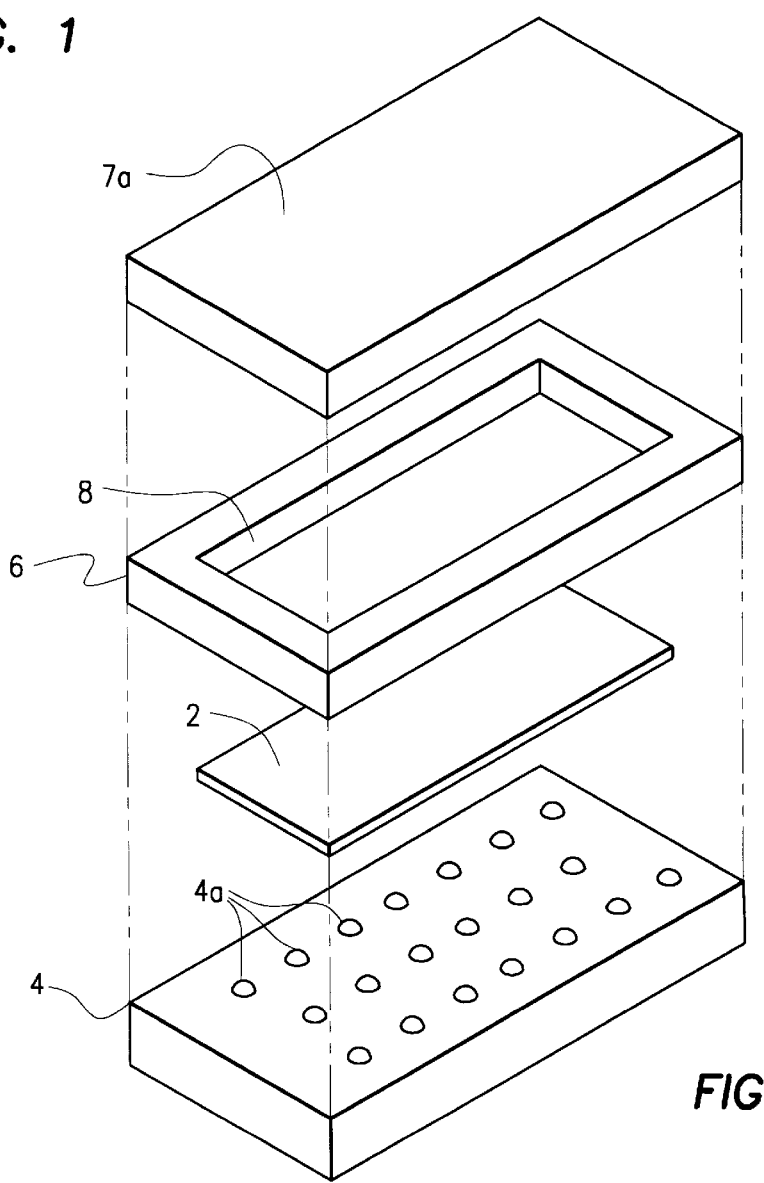
FIG. 2 shows an exploded view of the parts that go within a production socket.

There are at least three means for orienting the bare semiconductor die 2 onto the elastomeric probes 4a which are permanently mounted upon the circuit pads 4b of the die carrier 4. FIG. 2 shows one means for orienting; namely, an alignment template 6. The alignment template 6 is permanently mounted onto the die carrier 4 (as is also shown in FIGS. 1, 3, 5 and 6). Referring again to FIG. 2, the alignment template 6 contains an aperture 8 corresponding to the size and shape of the bare die 2 being tested. This alignment template 6 is designed to receive the bare die 2 and to orient the bond pad 2a pattern of the die 2 into alignment with the corresponding electrically conductive elastomeric probes 4a of the die carrier 4.

Still referring to FIG. 2, the alignment template 6 has an outer perimeter, size and shape which is substantially the same as the outer perimeter of the die carrier 4. Furthermore, the alignment template 6 is made out of a substance whose thermal coefficient of expansion matches that of the die carrier 4 and is designed to be permanently mounted on top of it. For example, the alignment template 6 may be made either out of a polyimide sheet, a printed circuit board, a ceramic material or any other high temperature, high dielectric strength material. The corresponding die carrier 4 may be made out of printed circuit board, ceramic or other high temperature, high dielectric strength materials. As is shown in FIGS. 1, 3, 5 and 6, the alignment template 6 is attached to the top surface of die carrier 4.

In the preferred embodiment of this invention, the use of ceramic substrate material for fabrication of the die carrier 4 and a polyimide alignment template 6 are utilized. It is not significant that the practitioner utilize a substance other than printed circuit board material for the die carrier or a polyimide sheet for the alignment template. Thus, the actual embodiment or material of an alignment template is not significant and is included herein as a part of the invention.

Figure 4:
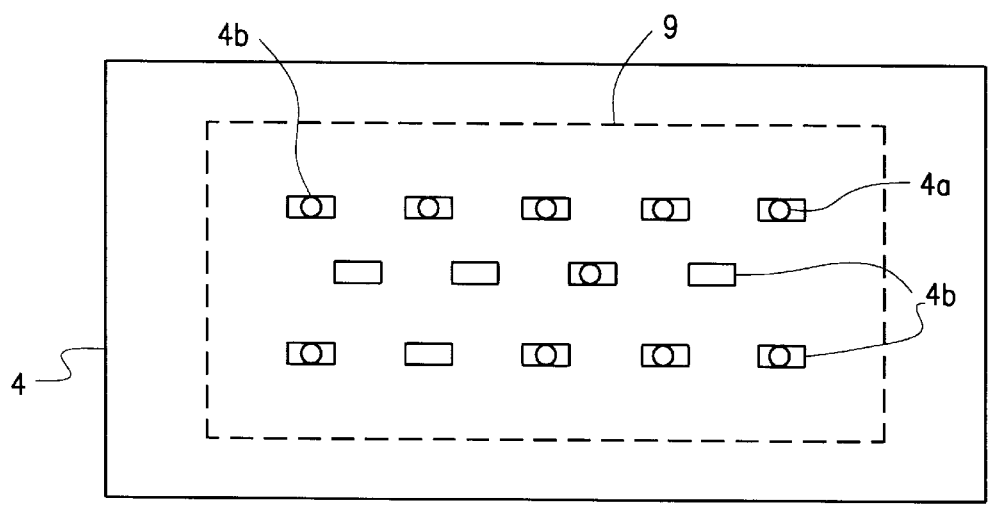
FIG. 4 shows a top view of a die carrier with guidance points.

In another embodiment of the means for orienting the die in position for testing, small and firm protrusions placed to define the area in which a bare die 2 is to be placed, herein "guidance points 9", are permanently mounted onto the die carrier 4. Referring to FIG. 4, the bare die 2 (not shown) fits within the pattern of guidance points 9 such that the bond pads 2a of bare die 2 (not shown) contact the elastomeric probes 4a of the die carrier 4 whenever the die 2 is placed within the pattern of guidance points 9. It is helpful to visualize the arrangement of these guidance points 9 as a series of fence posts which define the perimeter of the shape of the die wherein the die 2 fits exactly within this perimeter of guidance points 9. FIG. 4 illustrates a top view of this relationship between the arrangement of circuit pads 4b of a die carrier 4 and an arrangement of guidance points 9. Note that not all of the circuit pads 4b contain a conductive elastomeric probe 4a. The only requirement is that, at a minimum, the circuit pads 4b through which electrical signals must be supplied or monitored will contain elastomeric probes 4a. However, for other reasons, a practitioner can determine if it is desirable to have additional elastomeric probes. For example, requirements of structural support or engineering economy may encourage the utilization of "extra" probes 4a.

In another embodiment of the means for orienting, a robotic device (not shown), i.e., a computer controlled mechanical arm, is used to pick up the die 2 from an input tray or "waffle pack" (not shown), place it onto the die carrier 4 with high precision, and to hold the bare die 2, onto the elastomeric bumps 4a of the die carrier 4 such that the die bond pads 2a maintain electrical continuity with the circuit pads 4b of the carrier 4. To establish this electrical continuity, the robot arm (not shown) not only orients the die 2 such that the die bond pads 2a are in communication alignment with the circuit pads 4a of the die carrier, but also pushes or forces the die 2 at least to the point that the bond pads 2a are in firm and electrical contact with the electrically conductive elastomeric probes 4b. The robotic mechanism is programmed to place the die 2 repeatably and with great accuracy, thereby providing for a higher rate of handling than with manual placement. To aid in placement accuracy, optical alignment may be used with the robotic mechanism. The robotic mechanism also can remove the tested die 2 from the carrier 4 and place it in the appropriate output tray or waffle pack, separating good die 2 from failures. The obvious advantage of this embodiment is that it is oriented for assembly line style testing with low overhead labor costs.

There are at least three embodiments for the means for connecting the die to a given test instrument. One embodiment is seen in FIG. 1 where the means for connecting is standard circuit wiring which electrically connects the circuit pads 4b of the die carrier 4 to its leads 5. Each circuit pad 4b of the die carrier 4 will be connected to at least one lead 5 of the die carrier 4.

FIG. 1 also illustrates bare die 2 being within the alignment template 6 wherein the bond pads 2a of the bare die 2 are in contact with the elastomeric probes 4a which are permanently mounted on the circuit pads 4b of the die carrier 4 which in turn are connected to the individual leads 5 through the connection lines 4c. For the sake of clarifying the invention, the figures show bare die 2 with raised bond pads 2a. However, it is common to recess the bond pads 2a into the die. Thus, the malleable nature of the probes 4a assists in establishing continuity between the bond pads 2a and the probes 4a. The leads 5 and connection lines 4c (and connection lines lob of the carrier connector 10 as is shown in FIG. 3) used to interface the die carrier to other circuity may vary in composition and orientation and are not a significant part of this invention.

However, there may be leads 5 on the die carrier 4 which are unconnected to the circuit pads 4b. The exact arrangement or electrical interconnection between the circuit pads 4b and the leads 5 is a function of the number of bond pads 2a of the die 2 to which electrical continuity must be established for the purposes of testing. Because such arrangements will vary widely according to the particular die 2 being testing in relation to the test requirements for that die 2, the specific arrangement cannot be specified herein. However, one skilled in the art can readily ascertain without undue experimentation what the interconnect scheme should be.

Figure 3:
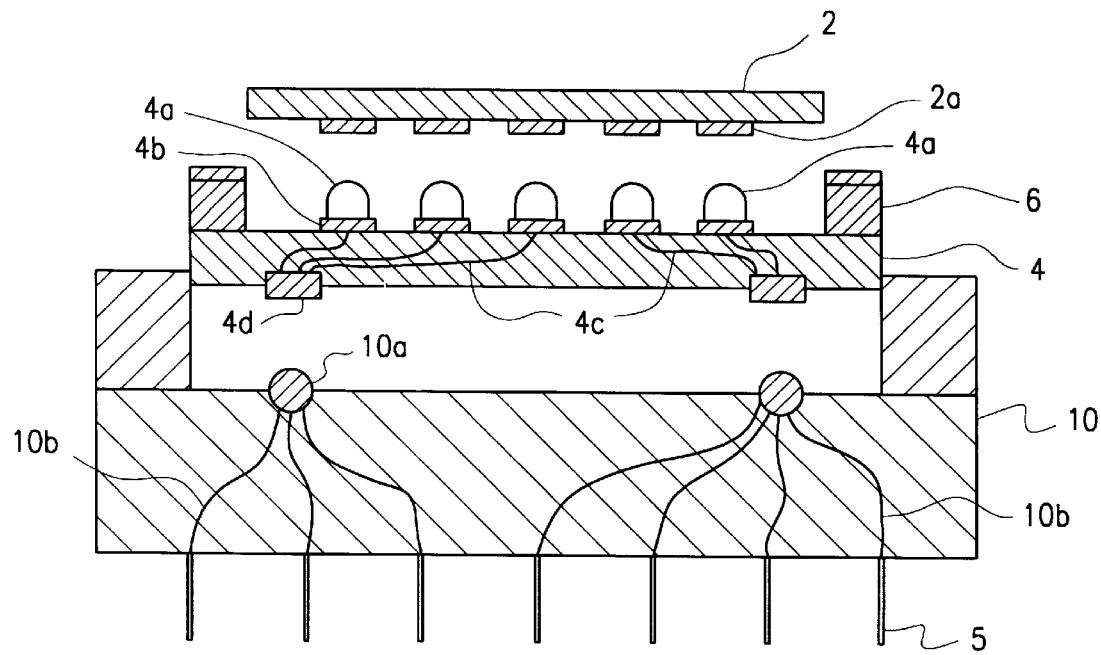
FIG. 3 shows a cutaway view of a bare die, an alignment board, a die carrier and a carrier connector.

In a second embodiment of the means for connecting, as is shown in FIG. 3, a die carrier 4 mates with a carrier connector 10. The circuit pads 4b of the die carrier 4 are placed upon its top surface while its connection pads 4d are placed on its bottom side. The carrier connector's connection pads 10a are individually connected to the leads 5 of the carrier connector 10 through connection lines 10b.

The connection pads 4d of the die carrier 4 and the connection pads 10a of the carrier connector 10 can be arranged in any format. One good arrangement is to have a row of connection pads 4d of the die carrier 4 at each end of the die carrier 4. The carrier connector 10 contains a similar arrangement wherein the row of the carrier connector's connection pads 10a on the carrier connector 10 is designed to make electrical contact with the row of connection pads 4d of the die carrier 4. The arrangement of carrier connector's connection pads 10a is immaterial so long as the placement corresponds with, or is a mirror image of, the connection pads 4d of the die carrier 4. One advantage of this embodiment, namely the use of a carrier connector 10, is that one carrier connector 10 could interface with a multitude of die carriers 4 with a matching arrangement of connection pads 4d.

Figure 5:
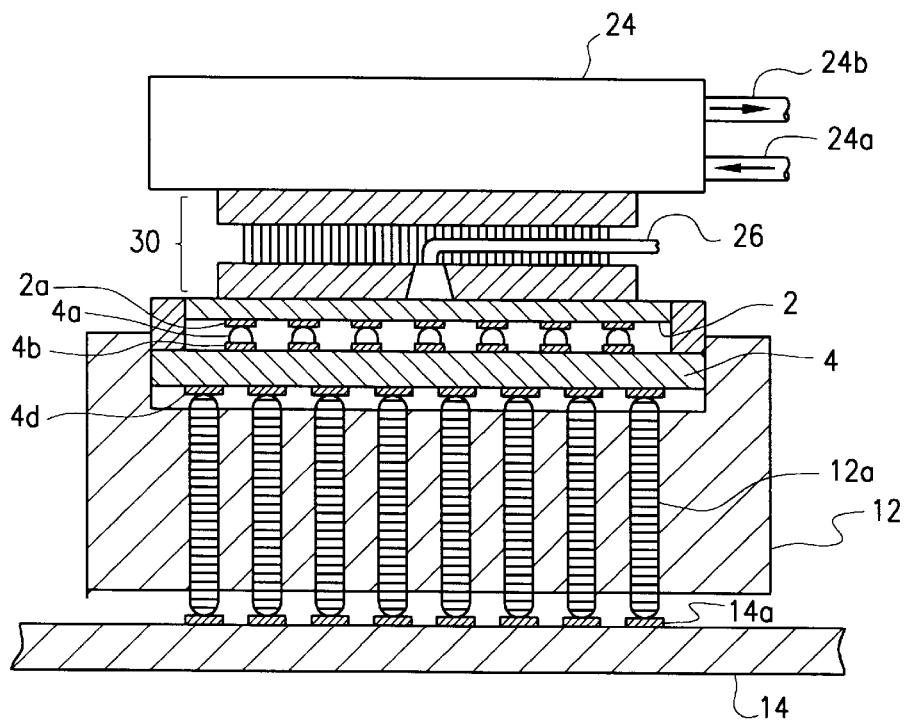
FIG. 5 shows a cutaway view of a die carrier in a surface mount configuration.

In a third embodiment of the means for connecting, as is shown in FIG. 5, a surface mounted carrier connector 12 is mounted to the surface of a burn-in board 14 (or "mother board"). However, instead of utilizing metal pins (not shown) which must be soldered to the burn-in board 14, this surface mounted carrier connector 12 uses an elastomeric interconnection lead 12a, as disclosed by U.S. Pat. No. 5,074,947, to establish electrical continuity between the burn-in board connection pads 14a and the bottom connection pads 4d of a die carrier 4. Use of this type of carrier connector for surface mount applications is advantageous because of lower labor cost in installing it when compared to the carrier connector 12 or any other device utilizing metal leads 5 which require soldering of individual leads 5. Further, the elastomeric interconnect leads 12a have an increased frequency bandwidth in comparison to the thin metallic leads 5a of the standard carrier connector.

Referring again to FIG. 2, the ceramic spacer 7a is designed to be placed between the alignment template 6 and a socket lid 7 (as shown in FIG. 1) of a production socket (not shown) which houses the die carrier 4, the alignment template 6 and the bare die 2. The purpose of the spacer is to urge the die against the elastomeric probes 4a. However, the spacer and production socket (not shown) are designed so that thermoelectric cooler (TEC) 30 (as is shown in FIG. 5) can be substituted for the spacer 7a to allow for testing at temperatures above or below ambient.

Referring to FIG. 5, the preferred mechanical and physical relationships between an auxiliary cooling heat exchanger 24, a thermoelectric cooler 30, a bare die 2, a die carrier 4 and surface mounted carrier connector 12, in a surface mount socket configuration are shown. The TEC 30 is placed adjacent to and is urged into direct contact with the bare die 2. Furthermore, an auxiliary cooling heat exchanger 24 is urged against the hot side of the TEC 30. This configuration is used whenever the die 2 must be tested at non-room temperatures, or when it is necessary to overcome internal heating of the bare die 2. Such a configuration will support the range of temperatures required for all known certification procedures including military certification for the bare die 2. Specifically, military certification requires that the die be operationally certified at minus 55° Celsius as well as at plus 125° Celsius. If this configuration is used for testing discrete components or other devices, a practitioner should insure that its TEC is capable of supporting the rigid temperature range.

There are various methods which can be used for heating and cooling the die 2 during testing at extended temperatures. One method includes placing the die 2 and a die carrier 4 within the heating/cooling chamber of a temperature forcing unit (not shown) of some sort.

Heating and cooling chambers (not shown), however, take significantly longer than a TEC/auxiliary cooler to raise or lower the die temperature. A TEC 30, as is shown in FIG. 5, raises or lowers the temperature of the die 2 rapidly, owing to the use of conductive rather than convective heat transfer. The use of such a system greatly reduces overall test time and therefore, cost of performing the test. For instance, the use of a convective temperature forcing device such as a conventional oven (not shown) can take several times as long for the die 2 to reach the desired temperature. The method of using the thermoelectric cooler/heater is well known in the art and can be readily determined from the vendors of such devices.

The thermoelectric cooler shown in FIG. 5 includes vacuum line 26 for holding the die. An auxiliary cooling system may be used, containing an inlet line 24a, and an outlet line 24b for circulating cooled water through the auxiliary cooling system 24 which in turn further cools the TEC hot side. Finally, the inventor has found that it may be advantageous to purge the die with nitrogen gas to prevent frost build-up.

Figure 6:
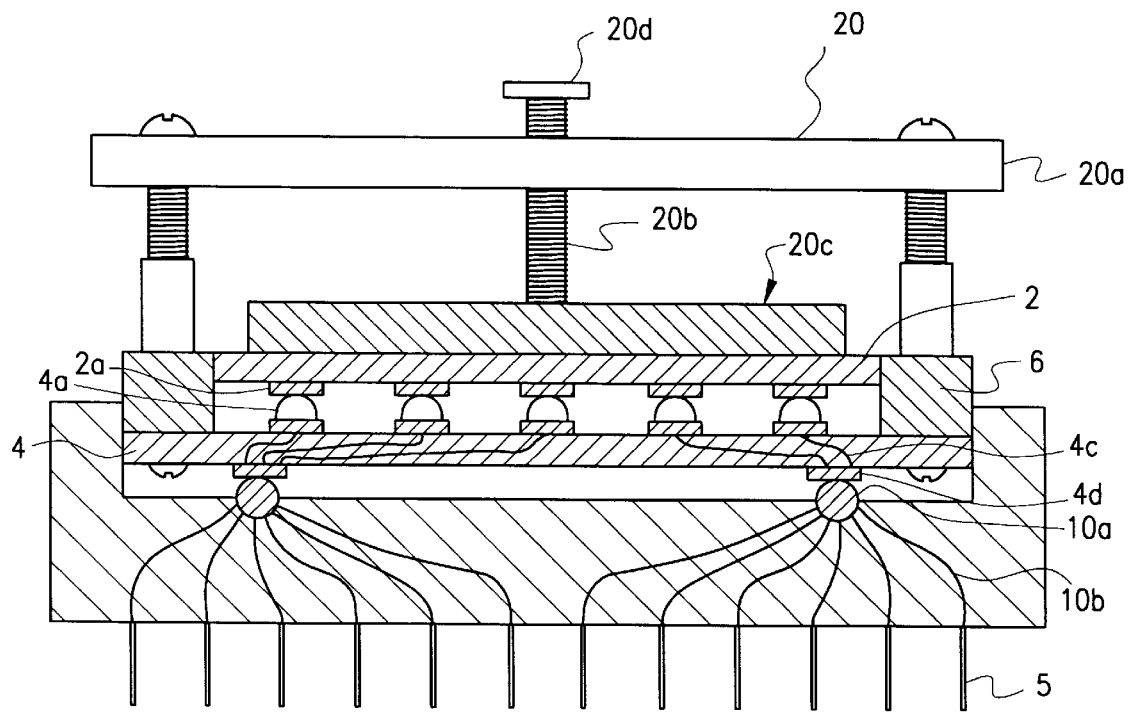
FIG. 6 shows a die clamp for room temperature or oven testing and a die carrier with a carrier connector.

Referring to FIG. 6, the clamp 20 supports "burn-in" testing in a conventional oven. Clamp 20, which is attached to the die carrier 4, will hold the die 2 in place such that the bond pads 2a of the die 2 maintain electrical continuity with the electrically conductive elastomeric probes 4a which are permanently attached to the circuit pads 4b of the die carrier 4. To use the clamp 20 of FIG. 6, one merely places the die 2 within the aperture 8 as shown in FIG. 2, of the alignment template 6 and then one turns the knob 20d in a clockwise manner. The bolt 20b will rotate in a downward manner through clamp plate 20a thereby forcing clamp press 20c in a downward manner to urge the bare die 2 against the electrically conductive elastomeric bumps 4a. Note that a production socket (not shown) could accomplish the same task if ceramic spacer 7a is placed within the socket. Because the die carrier 4 is electrically connected with the carrier connector 10, the carrier connector 10 may be plugged into a burn-in board 14 for the continuous "burn-in" testing process. The burn-in board 14, in turn, is connected to various pieces of test equipment through standard wiring in a manner well understood by those skilled in the art.

Historically, die 2 have been "burned in" after being packaged. Because electrical contacts with the external leads of the package can be reliably maintained, there is little reason to be concerned that electrical continuity will be lost during the burn-in process of a packaged die. However, since this single bare die 2 is not permanently packaged, continuous electrical contact during burn-in can no longer be assumed. Therefore, the method of burn-in for the bare die 2 may include continuous or periodic electronic data sampling to insure that electrical continuity is maintained. Once a die 2 successfully completes "burn-in" and post burn-in electrical tests, then that die 2 may be labeled or certified as a "known good die".

While "burn-in" is a term of art which varies significantly within the electronics industry, the inventor's burn-in process, as it relates to bare semiconductor die, is as follows: Initially, the die 2 is placed within a production socket (not shown) or within a die clamp 20 as is shown in FIG. 6 for pre-burn-in electrical testing. Once the die 2 is within a production socket (not shown) or a die clamp 20, it is connected to a piece of electrical test equipment for comprehensive functional testing of the die. In other words, the die is tested to the point that a practitioner can determine, in all probability, that each of the die's capabilities or functions works properly. Alternatively, the die 2 could be placed within a die carrier 4 that is thermally connected to a TEC 30, as is shown in FIG. 5, and then be comprehensively tested and exercised at an increased or decreased temperature. An advantage to performing a pre-burn-in test at a raised (or lowered) temperature is that a defective die is more likely to fail. Obviously, money is saved by identifying defective die as quickly as possible. The practitioner may utilize any type of production socket so long as it can house a die carrier 4 and an alignment template 6. In order to fully practice the invention as described herein, the production socket must also be able to house a spacer 7a sized to define the same geometric volume of space as defined by a thermoelectric cooler 30. One skilled in the art can readily determine the specific design of such a socket in order to practice this invention in a production environment.

Once a die successfully completes the pre-burn-in electrical test, whether at room or elevated temperatures, the die 2 and die carrier 4, whether in a production socket (not shown) or within a die clamp 20, are connected to a burn-in board 14 and then placed into an oven (not shown) and kept at a raised temperature for a length of time according to test or certification specifications. The inventor's preferred pre-burn-in method tests the die at elevated temperatures. However, other test procedures may require lowered temperatures. One example of a burn-in procedure would be to operate the die 2 through the burn-in board 14 within an oven at 125° Celsius for a minimum of 24 hours. For some applications, the die 2 may be kept in the oven for as many as 168 hours (or longer for other devices). The time that the die 2 is kept in the oven, as well as the oven temperature, is determined by the certification standard being followed for the particular die.

While the die 2 is within the oven, the die is "exercised" or operated at a level less than or equal to its full functional capability. Further, the operation may be monitored repetitively to insure the die 2 has successfully operated and that electrical continuity has been maintained during the burn-in process. Because the die 2 is housed in temporary packaging and continuous electrical continuity cannot be assumed, a given output signal or contents of a data register may be repetitively checked to verify that new or fresh signals or data are being introduced into the die and that the die 2 is satisfactorily processing the signals or data. Finally, it should be noted that these burn-in procedures could be carried out with a thermoelectric cooler instead of in an oven. As a practical matter, however, burn-in testing in an oven allows for a greater number of die to be "burned in" simultaneously and is therefore preferred.

After burn-in, post burn-in electrical tests are conducted. Post burn-in electrical testing includes electrically testing the die 2 at 25° Celsius (ambient or room temperature), then at a high temperature, up to (+) 125° Celsius, and finally at a low temperature, which can be as low as (−) 55° Celsius. Again, the desired temperatures and the length of time for the comprehensive electrical testing are a function of the certification standard being applied to the specific die 2. Use of the thermoelectric cooler 30 for the post burn-in tests greatly expedites the test procedures because the thermoelectric cooler, in conjunction with an auxiliary cooling heat exchanger 24, greatly reduces the time necessary to raise and lower the temperature of the bare die 2, within approximately one minute. Further, this series of tests at the various temperatures can be performed without having to physically move or reconnect the die to any other equipment.

In order to properly use the disclosed invention, it may be necessary to clean each of the bond pads 2a of the bare die 2 prior to the bare die 2 being placed onto the conductive elastomeric probes 4a. An oxide buildup on the bond pads 2a may cause high resistance and prevent probe 4a from making electrical contact with pad 2a. The oxide buildup on the bond pads 2a may be removed chemically, ultrasonically, physically through the use of some sort of scrubbing device, or through some other method such as ion etching. It should be noted that the die 2 must be handled properly during the entire process, including the cleaning process, to prevent it from being damaged by spurious electrostatic charges.

Figure 7:
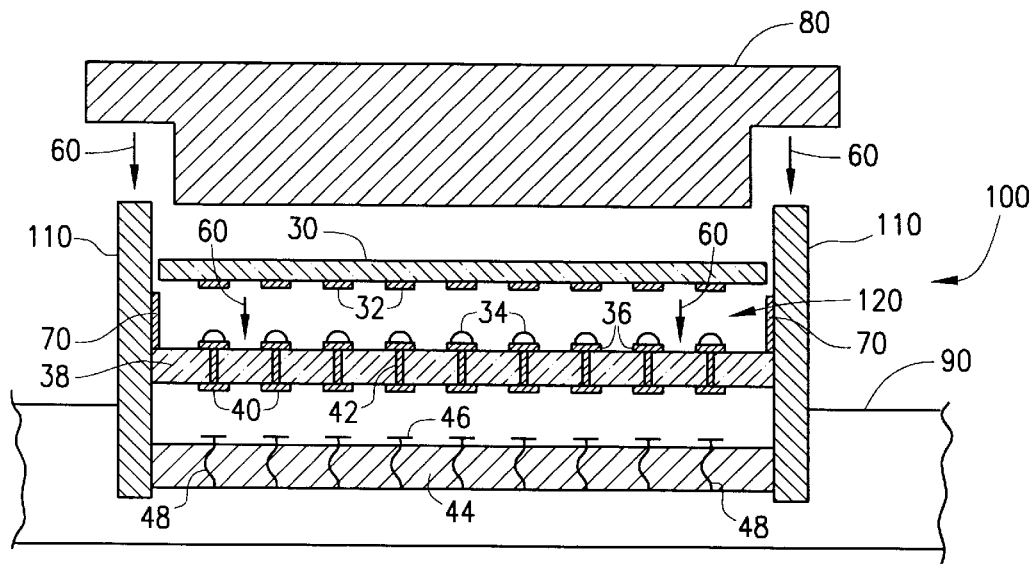
FIG. 7 shows a cutaway view of a carrier for testing fine pitch devices.

Referring now to FIG. 7, there is shown yet another embodiment of the invention wherein the test socket 100 is adapted for testing fine pitch devices including semiconductor wafers. Similar to the bare die test socket of FIGS. 1–6, the test socket 100 is adapted to receive the fine pitch device 30, which fine pitch device 30 is comprised of a plurality of contact points 32, which contact points 32 are contacted by the conductive elastomeric probes 34 of the test socket 100. As with the test socket of FIGS. 1–6 for the bare die 2, the malleable and electrically conductive elastomeric probes 34 are printed by conventional means (e.g., as practiced by Epoxy Technology of Boston, Mass.) onto circuit pads 36 in one embodiment of the invention, which circuit pads 36 are a part of the carrier 38. Moreover, as may be seen for the embodiment of FIG. 7, the carrier 38 further comprises connection pads 40 at the bottom of the carrier 38 wherein the circuit pads 36 are connected to the connection pads 40 by the traces 42.

To complete the circuitry, the test socket 100 of FIG. 7 also comprises a carrier connector 44, which carrier connector 44 is comprised of connector leads 46 which are adapted for electrically contacting the connection pads 40 of the carrier 38. As also may be seen, the carrier connector 44 comprises traces 48 which connect the connector leads 46 to external circuitry (not shown). Moreover, as may be seen, the test socket 100 is mounted directly onto a high temperature printed circuit board 90.

Continuing to examine the test socket 100 of FIG. 7, the test socket 100 is comprised of a plurality of the walls 110 which form an aperture 120 through which the fine pitch device 30 is placed to contact the elastomeric probes 34 of carrier 38. As with the test sockets of FIG. 1–6 for testing the bare die 2, it is important to have proper alignment of the contact points 32 of the fine pitch device 30 with the probes 34 of the test socket 100. Accordingly, and for alignment to occur, the fine pitch device 30 is urged in a downward direction as indicated by the arrows 60 through an alignment template 70 wherein proper alignment exists between the contact points 32 and the carrier 38. More specifically, the contact points 32 must align with the probes 34 whenever fine pitch device 30 is interposed through an alignment template 70.

While an alignment template 70 may be constructed of different materials and machined in different ways, an alignment template 70 should be carefully designed and fabricated to obtain and maintain proper alignment during test and burn-in test. More specifically, because it is known that the various materials utilized for fabricating the test socket and the alignment template will expand or contract during burn-in, it is important to fabricate an alignment template having a thermal co-efficient of expansion which is similar to that of the test socket and preferably out of materials having good thermal stability. Otherwise, in a worst case scenario, the semiconductor wafer could become misaligned relative to the probes of the test socket 100 during the testing process. In one embodiment of the invention, both the test socket 100 as well as the alignment template are fabricated with a polyetherimide such as Ultem® 1000 polyetherimides. Such polyetherimides provide high dielectric strength and excellent thermal stability and are therefore desirable. Additionally, alignment template 70 is laser machined to insure precision. A laser machined alignment template 70 can be used to align the semiconductor wafer 30 properly, even though there may be 5,000 or 10,000 bond pads 32 on the semiconductor wafer 30, because the overall dimensions and size of the semiconductor wafers 30 vary little, given current semiconductor wafer processing technologies. In this embodiment, the test socket 100 and alignment template 70 are both made out of Ultem® polyethermide. The socket 100, however, is mounted on a high temperature printed circuit board 90 as is shown in FIG. 7.

Continuing to examine the test socket 100 of FIG. 7, there is also shown cover 80 which may be used to urge the fine pitch device 30 in a downward direction 60 and to hold the fine pitch device 30 in place during testing or burn-in test. In yet another embodiment of the invention, however, cover 80 is replaced with a thermoelectric cooler similar to that thermoelectric cooler 30 shown in FIG. 5 wherein such TEC is sized and adapted for being urged against the semiconductor wafer 30, instead of the bare die 2.

It is important to note that the diagram of FIG. 7 contains bond pads 32, circuit pads 36, elastomeric probes 34 and connection pads 40 which are drawn out of scale for the purposes of illustration. By way of example, some fine pitch devices, namely, semiconductor wafers, may have 5,000 such bond pads 32. Thus, the relative size of probes 34, bond pads 32 and circuit pads 36 is very small in comparison to the test socket. One skilled in the art, however, may more readily appreciate the invention by the use of such exaggerated features in the drawings. Moreover, as indicated previously, circuit pads, by way of example, the circuit pads 36 of carrier 38 of FIG. 7, may be modified in size or shape so long as permanent electrical contact is made with elastomeric probes 34 (of FIG. 7).

Figure 8:
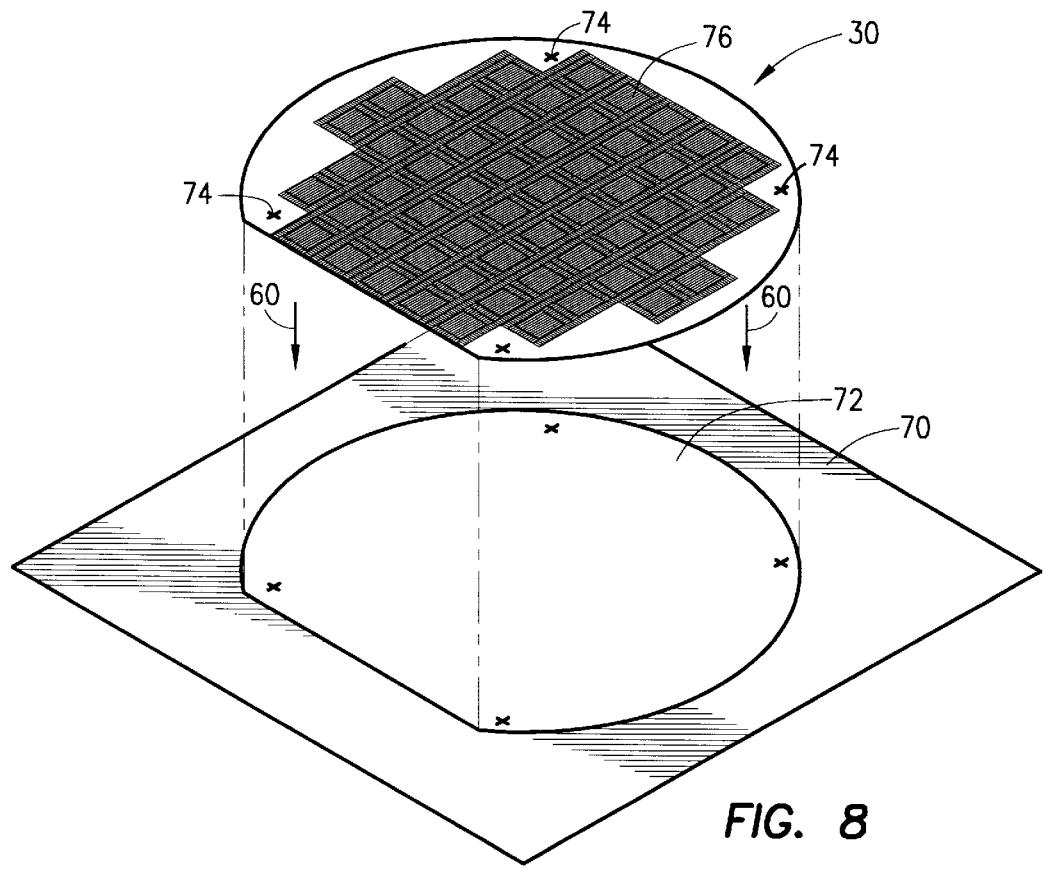
FIG. 8 is a perspective view illustrating one embodiment of the alignment template for a fine pitch device, and more specifically, a semiconductor wafer.

Referring now to FIG. 8, there is shown a perspective view of an alignment template 70 which comprises aperture 72, which is adapted to mate with the fine pitch device 30, which, for this example, is a semiconductor wafer, when the fine pitch device 30 is urged in a downward direction 60 through aperture 72. Moreover, as may be seen, the fine pitch device 30 also includes a plurality of optical marks 74 which are used to optically align semiconductor wafer 30 with an optical device (not shown).

Continuing to refer to FIG. 8, there is shown another embodiment of the invention wherein an alignment template 70 is used to place the fine pitch device 30 into approximate alignment while a standard optical device for aligning semiconductor devices is used to locate predesignated marks 74 on the fine pitch device 30 and to adjust the alignment of the fine pitch device 30. Optical devices for aligning the fine pitch device 30 or the bare die 2 (of FIG. 1) and the method of using such devices are known and can be readily appreciated by those skilled in the art. In one embodiment of the invention (not shown) wherein such an optical device is used for aligning the fine pitch device 30, the fine pitch device 30 is held in place by a vacuum instead of an alignment template 70. The position of the fine pitch device is adjusted by adjusting the position of the vacuum device. Once again, however, there are many different devices which may be used to handle and move the fine pitch device 30, each of which may be used with the invention disclosed herein.

Figure 9:
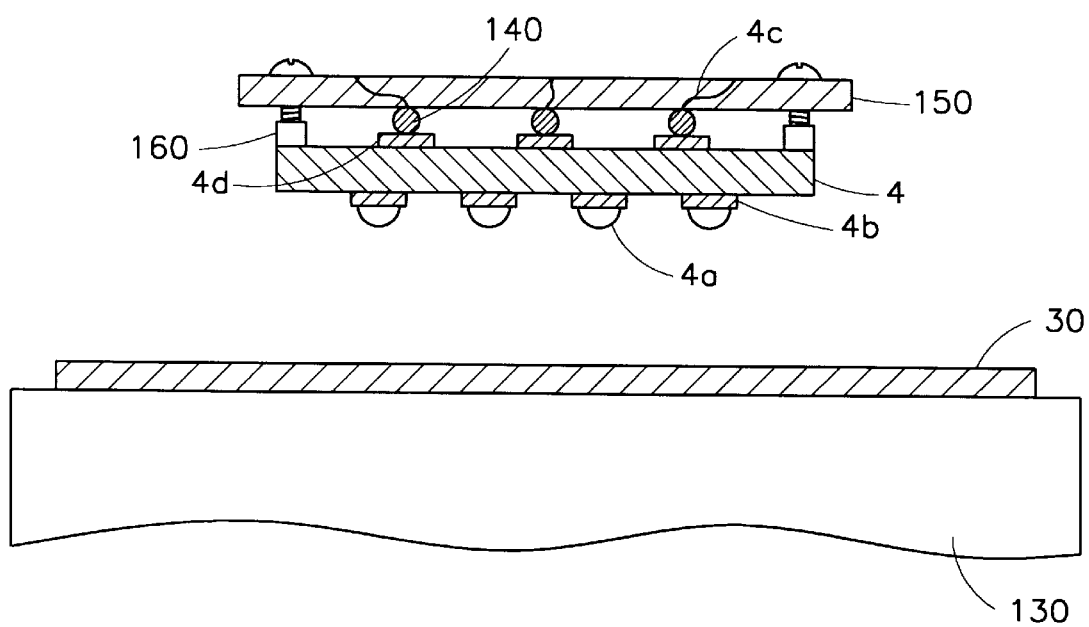
FIG. 9 shows an individual die on a semiconductor wafer being electrically probed.

Referring now to FIG. 9, a wafer probe tester is shown. Such a tester, well known to those skilled in the art and widely available from many sources, comprises a platform 130 and probe card 150. A die carrier 4, previously described, is mounted to the probe card 150 with standard mounting brackets 160. A semiconductor wafer 30 is disposed between the platform 130 and probe card 150 and held to the platform 130 by a vacuum in a conventional, well known manner. Electrical contact to the die carrier from the probe card 150 is made by pins 140 contacting connection pads 4d on the die carrier 4. The connection pads 4d are electrically connected to circuit pads 4b. Elastomeric probes 4a are permanently mounted on the circuit pads 4b. The wafer probe machine places the elastomeric probes against the pads of the die. The elastomeric probes 4a are in a mirror image of the pads on the die. The methods for aligning the pads of the die are well known to those skilled in the art. One method requires manual adjustment while looking through a hole in the die carrier. Another method employs the use of split vision optics. Once electrical testing is performed on a die, the wafer probe machine moves the probe card 150 with the die carrier 4 attached to the next die.

As was discussed in the background, the prior art methods of producing integrated circuits include using a wafer probe to perform simple DC and some AC testing to preliminarily eliminate 80% of all bad die 76 on semiconductor wafer 30, then to saw the wafer 30 and package the bare die 2 to create an integrated circuit prior to performing certification tests. The process of certifying an integrated circuit includes performing 100% pre-burn-in testing, then burn-in and then 100% post burn-in testing. At such point, integrated circuits having failed along the way are rejected and the rest are processed for sale or for use. With the invention herein, however, a different method may be used with respect to producing integrated circuits and other semiconductor devices formed on a semiconductor wafer, one that significantly reduces the number of steps involved in testing all of the individual integrated circuits produced from a semiconductor wafer.

Referring again to FIG. 1, the inventive method, for wafers, includes the step of performing wafer level burn-in tests. Specifically, because test socket 100 of FIG. 7 allows for electrical contact to be made with bond pads 32 of the fine pitch device 30 in this case, a semiconductor wafer, the individual die on the semiconductor wafer can be exercised during burn-in test. During burn-in test, a "map" is created which tracks die 76 which have failed on fine pitch device 30. The term "map" is used to represent any sort of recording of die 76 which are failed in a manner that such failed die 76 may be positively determined and separated. It is understood that, generally, the methods of performing burn-in test for bare die may be practiced with the inventive methods herein for semiconductor wafers. Thus, burn-in may be performed in an oven or with a thermoelectric cooler.

When fine pitch device 30 is diced post burn-in to separate die 76, the failed die 76, as indicated by the map, are separated and discarded. After failed die 76 are separated from fine pitch device 30, the remaining bare die 2 undergo complete testing to verify complete and proper performance of bare die 2. For this stage of the test process, the test sockets of FIGS. 1–6 described above may be utilized. Bare die 2 which pass this stage of the test process are known good die which may be either packaged individually as an integrated circuit or as a part of a multi-chip module. Alternatively, after the wafer level burn-in and dicing, the remaining bare die 2 may also be packaged prior to being fully tested.

It is worth noting that a great majority of failed die 76 will be detected during the wafer level burn-in test. Thus, because a fine pitch device 30 can contain up to several thousand die 76, the elimination of any step in the procedure of producing a known good die 2 may, in fact, save several thousand steps, one step for each die 76 on the wafer. Thus, by way of example, if a wafer contains 2,000 die 76, then 2,000 pre-burn-in tests are avoided by the mere fact that such pre-burn-in tests are not necessary since a die 76 and a fine pitch device 30 can be exercised while undergoing burn-in test. Additionally, if, by way of example, 400 of the 2,000 die 76 are bad, 50 of which would have failed during burn-in and not pre-burn-in, then the post burn-in procedure is avoided for the 50 bad die 76 which actually failed during burn-in test. Moreover, by utilizing the bare die test sockets shown in FIGS. 1–6, bare die 2 which were not failed during burn-in test may be tested completely after being diced and prior to packaging thereby saving, in this example, the unnecessary packaging of 450 bad die. Thus, as may be seen, performing wafer level burn-in with the current invention significantly reduces the number of steps performed in producing a lot of known good die 2 from fine pitch device 30.

The foregoing disclosure and description of the invention are given as illustrative and explanatory examples of the practice of the invention. Various changes in the size, shape, combination or elements of materials can be made without departing from the spirit and scope of the invention. Changes may also be made in the method of testing bare die 2 or other fine pitch devices 30 such as semiconductor wafers. For example, the certification requirements for a die or device which is mature and known to have low failure rates may be satisfied by eliminating the burn-in test procedures. As another example, the trackings made in reference to bare die 2 also apply to testing of fine pitch devices 30 such as semiconductor wafers whether explicitly stated or not. It is understood therefore, that the invention is not limited to the specific embodiments or methods disclosed and that many modifications and changes will be apparent from the description and drawings without departing from the scope of the attached claims.

Moreover, it is understood that variations in the carrier and inventive methods may be made according to the type of fine pitch device being tested. By way of example, if the fine pitch device 30 of FIG. 7 is a printed circuit board, then the requirement for burn-in-test may be modified or even eliminated. As may be seen, therefore, the disclosure is directed to describing a test socket for testing fine pitch devices and is not limited merely to bare die and semiconductor wafers, but applies to any fine pitch device. Accordingly, one skilled in the art may readily appreciate changes in the physical dimensions of a carrier, and perhaps methods (as determined by test goals) to perform tests upon the specific fine pitch device. Such changes may be necessary to test fine pitch devices such as bare die, unpackaged semiconductor devices such as semiconductor wafers, as well as packaged semiconductor devices and modern circuitry for testing or carrying semiconductor devices including probe cards, bare printed circuit boards, populated circuit boards, ball grid arrays, ceramic ball grid arrays and chip-scale packages.

What is claimed is:

1. A carrier system, comprising:
   a substantially planar substrate having at least one circuit pad thereon;
   at least one elastomeric probe in the form of a smooth-ended, conductive polymer bump, said at least one elastomeric probe permanently mounted upon said at least one circuit pad; and
   an alignment template with an aperture approximating the shape of a fine pitch device, said alignment template for guiding the placement of said fine pitch device having one or more contacts, relative to said at least one circuit pad, wherein said at least one elastomeric probe facilitates a temporary electrical connection between said at least one circuit pad and one of said one or more contacts when said fine pitch device is placed in proximate position relative to said substantially planar substrate.

2. The carrier system of claim 1, wherein said fine pitch device is a probe card.

3. The carrier system of claim 1, wherein said fine pitch device is a bare printed circuit board.

4. The carrier system of claim 1, wherein said fine pitch device is a populated printed circuit board.

5. The carrier system of claim 1, wherein said fine pitch device is a chip-scale package.

6. The carrier system of claim 1, wherein said fine pitch device is a bare die.

7. The carrier system of claim 1, wherein said fine pitch device is a semiconductor wafer.

8. The carrier system of claim 1, wherein said fine pitch device is a ball grid array device.

9. The carrier system of claim 1, wherein said fine pitch device is a ceramic ball grid array device.

10. The carrier system of claim 1, wherein said fine pitch device is a single die of and attached to a semiconductor wafer.

11. A carrier system, comprising:

a substrate having a contact pad thereon;

an elastomeric probe formed on said contact pad, said probe for facilitating a temporary electrical connection between said contact pad and a corresponding contact point of an electrical device; and a thermal electric cooler positioned on top of, and in thermal communication with, said electrical device to urge said electrical device against the elastomeric probe and to change the temperature of said electrical device.

12. The carrier system of claim 11, wherein said electrical device comprises a probe card.

13. The carrier system of claim 11, wherein said electrical device comprises a printed circuit board.

14. The carrier system of claim 13, wherein said printed circuit board comprises a populated board area.

15. The carrier system of claim 11, wherein said electrical device comprises a chip-scale package.

16. The carrier system of claim 11, wherein said electrical device comprises a semiconductor wafer.

17. The carrier system of claim 11, wherein said electrical device comprises a ball grid array package.

18. The carrier system of claim 17, wherein said ball grid array package comprises a ceramic portion.

19. The carrier system of claim 11, wherein said electrical device comprises a singulated die.

20. The carrier system of claim 11, wherein said electrical device comprises a semiconductor die attached to a wafer.

21. A carrier system, comprising:

a carrier having a plurality of contact pads deposed on a top surface of said carrier and at least three individual leads deposed on a bottom surface of said carrier, at least one of said plurality of contact pads in electrical communication with at least one of said at least three individual leads, said at least three individual leads arranged so as to matedly engage a socket connector; and malleable means formed on at least one of said plurality of contact pads, said malleable means permanently and rigidly bonded to said at least one of said plurality of contact pads, for facilitating a temporary electrical connection between said at least one of said plurality of contact pads and a corresponding contact point of an electrical device.

22. The carrier system of claim 21, wherein said malleable means comprises a conductive polymer bump formed by a screen print.

23. The carrier system of claim 21, wherein said malleable means comprises a conductive polymer bump formed by a stencil print.

24. The carrier system of claim 21, wherein said malleable means comprises a conductive polymer bump formed by photolithography.

* * * * *